US010056182B2

(12) United States Patent
Murtagian et al.

(10) Patent No.: US 10,056,182 B2
(45) Date of Patent: Aug. 21, 2018

(54) SURFACE-MOUNT INDUCTOR STRUCTURES FOR FORMING ONE OR MORE INDUCTORS WITH SUBSTRATE TRACES

(71) Applicant: Intel Corporation, Santa Clara, CA (US)

(72) Inventors: Gregorio R. Murtagian, Phoenix, AZ (US); Robert L. Sankman, Phoenix, AZ (US); Brent S. Stone, Chandler, AZ (US); Kaladhar Radhakrishnan, Chandler, AZ (US); Joshua D. Heppner, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 39 days.

(21) Appl. No.: 14/616,508

(22) Filed: Feb. 6, 2015

(65) Prior Publication Data

US 2015/0155092 A1    Jun. 4, 2015

Related U.S. Application Data

(63) Continuation of application No. 13/715,016, filed on Dec. 14, 2012, now abandoned.

(51) Int. Cl.
*H01F 27/29* (2006.01)
*H01F 5/00* (2006.01)
(Continued)

(52) U.S. Cl.
CPC ....... *H01F 27/2852* (2013.01); *H01F 17/045* (2013.01); *H01F 27/02* (2013.01);
(Continued)

(58) Field of Classification Search
CPC .............................. H01F 27/2823; C21D 1/10
(Continued)

(56) References Cited

U.S. PATENT DOCUMENTS 4,597,169 A * 7/1986 Chamberlin ............ H01F 21/08
29/593
5,351,167 A    9/1994 Wai et al.
(Continued)

FOREIGN PATENT DOCUMENTS

JP    2005191559 A    7/2005
JP    2010507225 A    3/2010
(Continued)

OTHER PUBLICATIONS

Office Action dated Dec. 27, 2016 for Korean Patent Application No. 2015-7007993, 7 pages.
(Continued)

*Primary Examiner* — Elvin G Enad
*Assistant Examiner* — Kazi Hossain
(74) *Attorney, Agent, or Firm* — Schwabe, Williamson & Wyatt, P.C.

(57) ABSTRACT

Embodiments of the present disclosure are directed towards an inductor structure having one or more strips of conductive material disposed around a core. The strips may have contacts at a first end and a second end of the strips, and may be disposed around the core with a gap between the contacts. The inductor structure may be mounted on a surface of a substrate, and one or more traces may be formed in the surface of the substrate to electrically couple two or more of the strips of conductive material to one another to form inductive coils. Other embodiments may be described and/or claimed.

9 Claims, 11 Drawing Sheets

(51) Int. Cl.
*H01F 27/02* (2006.01)
*H01L 27/08* (2006.01)
*H05K 7/00* (2006.01)
*H01F 27/28* (2006.01)
*H01F 17/04* (2006.01)
*H01F 27/06* (2006.01)

(52) U.S. Cl.
CPC ............ *H01F 27/027* (2013.01); *H01F 27/06* (2013.01); *H01F 27/2847* (2013.01); *H01F 27/292* (2013.01); *H01F 2027/065* (2013.01); *H01F 2027/297* (2013.01); *Y10T 29/4902* (2015.01)

(58) Field of Classification Search
USPC .................... 336/200, 232, 192; 257/531; 361/760–784
See application file for complete search history.

(56) References Cited

U.S. PATENT DOCUMENTS

| | | |
|---|---|---|
| 5,805,431 A | 9/1998 | Joshi et al. |
| 6,091,310 A | 7/2000 | Utsumi et al. |
| 6,108,212 A | 8/2000 | Lach et al. |
| 6,367,143 B1 | 4/2002 | Suimura |
| 6,370,013 B1 | 4/2002 | Iino et al. |
| 6,445,271 B1 | 9/2002 | Johnson |
| 6,556,420 B1 | 4/2003 | Naito et al. |
| 6,606,237 B1 | 8/2003 | Naito et al. |
| 6,775,150 B1 | 8/2004 | Chakravorty et al. |
| 6,876,554 B1 | 4/2005 | Inagaki et al. |
| 6,952,049 B1 | 10/2005 | Ogawa et al. |
| 6,970,362 B1 | 11/2005 | Chakravorty |
| 7,025,607 B1 | 4/2006 | Das et al. |
| 7,209,011 B2 | 4/2007 | Welland et al. |
| 7,345,563 B2 | 3/2008 | Pavier |
| 7,751,205 B2 | 7/2010 | Kariya et al. |
| 7,768,370 B2 | 9/2010 | Brown |
| 7,902,662 B2 | 3/2011 | Amey et al. |
| 8,166,447 B1 | 4/2012 | Smith et al. |
| 8,178,435 B2 | 5/2012 | Lin |
| 8,274,330 B2 | 9/2012 | Paul et al. |
| 8,487,400 B2 | 7/2013 | Lin |
| 8,692,368 B2 | 4/2014 | Pan et al. |
| 9,048,112 B2 | 6/2015 | Pan et al. |
| 2002/0070423 A1 | 6/2002 | Takafuji |
| 2002/0085334 A1 | 7/2002 | Figueroa et al. |
| 2002/0140538 A1 | 10/2002 | Yer et al. |
| 2002/0163396 A1 | 11/2002 | Lim et al. |
| 2002/0172025 A1 | 11/2002 | Megahed et al. |
| 2002/0185303 A1 | 12/2002 | Takeuchi et al. |
| 2002/0191366 A1 | 12/2002 | Naito et al. |
| 2003/0116843 A1 | 6/2003 | Iijima et al. |
| 2003/0116857 A1 | 6/2003 | Taniguchi et al. |
| 2003/0142460 A1 | 7/2003 | Naito et al. |
| 2004/0041270 A1 | 3/2004 | Shimizu et al. |
| 2004/0089929 A1* | 5/2004 | Chiu ................ H01L 23/29 257/678 |
| 2004/0125579 A1 | 7/2004 | Konishi et al. |
| 2004/0140553 A1 | 7/2004 | Naito et al. |
| 2004/0184219 A1 | 9/2004 | Otsuka et al. |
| 2004/0238942 A1 | 12/2004 | Chakravorty et al. |
| 2004/0256717 A1 | 12/2004 | Suenaga et al. |
| 2005/0087850 A1 | 4/2005 | Nishikawa et al. |
| 2005/0208705 A1 | 9/2005 | Iijima et al. |
| 2005/0242897 A1 | 11/2005 | Lim et al. |
| 2005/0248015 A1 | 11/2005 | Palanduz |
| 2005/0258447 A1 | 11/2005 | Oi et al. |
| 2005/0258548 A1 | 11/2005 | Ogawa et al. |
| 2005/0263874 A1 | 12/2005 | Shimizu et al. |
| 2005/0280146 A1 | 12/2005 | Cornelius |
| 2006/0014327 A1 | 1/2006 | Cho et al. |
| 2006/0109071 A1 | 5/2006 | Thongsouk et al. |
| 2006/0118931 A1 | 6/2006 | Ho et al. |
| 2006/0137905 A1 | 6/2006 | Kariya et al. |
| 2006/0145800 A1* | 7/2006 | Dadafshar ......... H01F 27/2847 336/82 |
| 2006/0151863 A1 | 7/2006 | Das et al. |
| 2006/0171130 A1 | 8/2006 | Konishi et al. |
| 2006/0193105 A1 | 8/2006 | Sakata et al. |
| 2006/0220175 A1 | 10/2006 | Guzek et al. |
| 2006/0279940 A1 | 12/2006 | Chakravorty et al. |
| 2006/0291177 A1 | 12/2006 | Choi et al. |
| 2007/0003781 A1* | 1/2007 | de Rochemont ...... B82Y 30/00 428/615 |
| 2007/0026662 A1* | 2/2007 | Kawano ............. H01L 21/4846 438/618 |
| 2007/0035020 A1 | 2/2007 | Umemoto |
| 2007/0045815 A1 | 3/2007 | Urashima et al. |
| 2007/0076392 A1 | 4/2007 | Urashima et al. |
| 2007/0121273 A1 | 5/2007 | Yamamoto et al. |
| 2007/0177331 A1 | 8/2007 | Das et al. |
| 2007/0205486 A1 | 9/2007 | Shioga et al. |
| 2007/0210866 A1 | 9/2007 | Sato et al. |
| 2007/0216020 A1 | 9/2007 | Shiraishi |
| 2007/0258225 A1 | 11/2007 | Inagaki et al. |
| 2007/0263364 A1 | 11/2007 | Kawabe et al. |
| 2007/0281394 A1 | 12/2007 | Kawabe et al. |
| 2007/0285907 A1 | 12/2007 | Nishikawa et al. |
| 2008/0002380 A1 | 1/2008 | Hazucha et al. |
| 2008/0029886 A1 | 2/2008 | Cotte et al. |
| 2008/0030968 A1 | 2/2008 | Mashino |
| 2008/0079118 A1 | 4/2008 | Bang et al. |
| 2008/0157897 A1 | 7/2008 | Tilmans et al. |
| 2008/0169120 A1 | 7/2008 | Inagaki et al. |
| 2008/0186247 A1 | 8/2008 | Cotte et al. |
| 2008/0204971 A1 | 8/2008 | Lee et al. |
| 2008/0217049 A1 | 9/2008 | Dudnikov |
| 2008/0224799 A1 | 9/2008 | Taniguchi |
| 2008/0239622 A1 | 10/2008 | Hsu et al. |
| 2008/0251285 A1 | 10/2008 | Sato et al. |
| 2008/0265399 A1 | 10/2008 | Chao |
| 2009/0140400 A1 | 6/2009 | Amey, Jr. et al. |
| 2009/0153421 A1 | 6/2009 | Rofougaran et al. |
| 2009/0160595 A1 | 6/2009 | Feng et al. |
| 2009/0237900 A1 | 9/2009 | Origuchi et al. |
| 2009/0266594 A1 | 10/2009 | Yoshikawa |
| 2009/0268418 A1 | 10/2009 | Choi et al. |
| 2009/0268419 A1 | 10/2009 | Choi et al. |
| 2009/0284941 A1 | 11/2009 | Oomori |
| 2009/0288279 A1 | 11/2009 | Dattaguru |
| 2010/0060381 A1 | 3/2010 | Das et al. |
| 2010/0109052 A1 | 5/2010 | Nakajima et al. |
| 2010/0163168 A1 | 7/2010 | Saita et al. |
| 2010/0163172 A1 | 7/2010 | Saita et al. |
| 2010/0178879 A1 | 7/2010 | Sato et al. |
| 2010/0181285 A1 | 7/2010 | Tanaka |
| 2010/0226108 A1 | 9/2010 | Inagaki et al. |
| 2010/0232126 A1 | 9/2010 | Maeda et al. |
| 2010/0300602 A1 | 12/2010 | Ichiyanagi et al. |
| 2010/0315790 A1* | 12/2010 | Imaoka ............. H01L 23/49838 361/748 |
| 2010/0327433 A1 | 12/2010 | Sweeney et al. |
| 2011/0018099 A1 | 1/2011 | Muramatsu |
| 2011/0031610 A1 | 2/2011 | Yamazaki et al. |
| 2011/0155433 A1 | 6/2011 | Funaya et al. |
| 2011/0156224 A1 | 6/2011 | Rokuhara et al. |
| 2011/0169164 A1 | 7/2011 | Nakamura et al. |
| 2011/0182039 A1* | 7/2011 | Kato ................. H01L 23/645 361/736 |
| 2011/0222255 A1 | 9/2011 | Kitano et al. |
| 2011/0294265 A1 | 12/2011 | Shioga et al. |
| 2012/0074521 A1 | 3/2012 | Imanaka et al. |
| 2012/0075216 A1 | 3/2012 | Black et al. |
| 2012/0098089 A1 | 4/2012 | Tago |
| 2012/0139108 A1 | 6/2012 | Kim et al. |
| 2012/0168217 A1 | 7/2012 | Hsu et al. |
| 2012/0241906 A1 | 9/2012 | Nakanishi |
| 2012/0261801 A1 | 10/2012 | Takano et al. |
| 2012/0261832 A1 | 10/2012 | Takano et al. |
| 2012/0293972 A1* | 11/2012 | Pan ................... H01L 25/16 361/772 |
| 2012/0306608 A1 | 12/2012 | Takenaka |

(56) References Cited

U.S. PATENT DOCUMENTS

| | | |
|---|---|---|
| 2012/0314389 A1 | 12/2012 | Takenaka |
| 2013/0015871 A1 | 1/2013 | Cleary et al. |
| 2013/0020667 A1 | 1/2013 | Kireev et al. |
| 2013/0020675 A1 | 1/2013 | Kireev et al. |
| 2015/0230338 A1 | 8/2015 | Hossain et al. |

FOREIGN PATENT DOCUMENTS

| | | |
|---|---|---|
| JP | 2011146517 A | 7/2011 |
| KR | 20020088212 A | 11/2002 |
| KR | 1020120083862 A | 7/2012 |

OTHER PUBLICATIONS

Office Action dated Jun. 17, 2016 for Korean Patent Application No. 2015-7007993, 12 pages.

International Search Report and Written Opinion in related matter PCT/US2013/066654, dated Feb. 25, 2014, 11 pages.

U.S. Appl. No. 13/664,264, filed Oct. 30, 2012, 29 pages.

Final Office Action issued in U.S. Application No. 13/715,016, filed Dec. 14, 2012, 10 pages.

Non-Final Office Action issued in U.S. Appl. No. 13/664,264, dated Oct. 8, 2014, 29 pages.

Office Action dated Feb. 9, 2016 for Japanese Patent Application No. 2015-532191, 14 pages.

International Preliminary Report on Patentability dated May 14, 2015, issued in International Application No. PCT/US2013/066654, filed Oct. 24, 2013, 8 pages.

Notice of Allowance issued in U.S. Appl. No. 13/664,264, dated Jan. 30, 2016, 14 pages.

Non-Final Office Action issued in U.S. Appl. No. 14/691,468, dated Feb. 5, 2016, 26 pages.

Notice of Allowance dated Jun. 23, 2016 for U.S. Appl. No. 14/691,468, 18 pages.

Final Office Action dated May 31, 2016 for Japanese Patent Application No. 2015-532191, 4 pages.

Office Action dated Feb. 9, 2017 for Korean Patent Application No. 2015-7007993, 8 pages.

\* cited by examiner

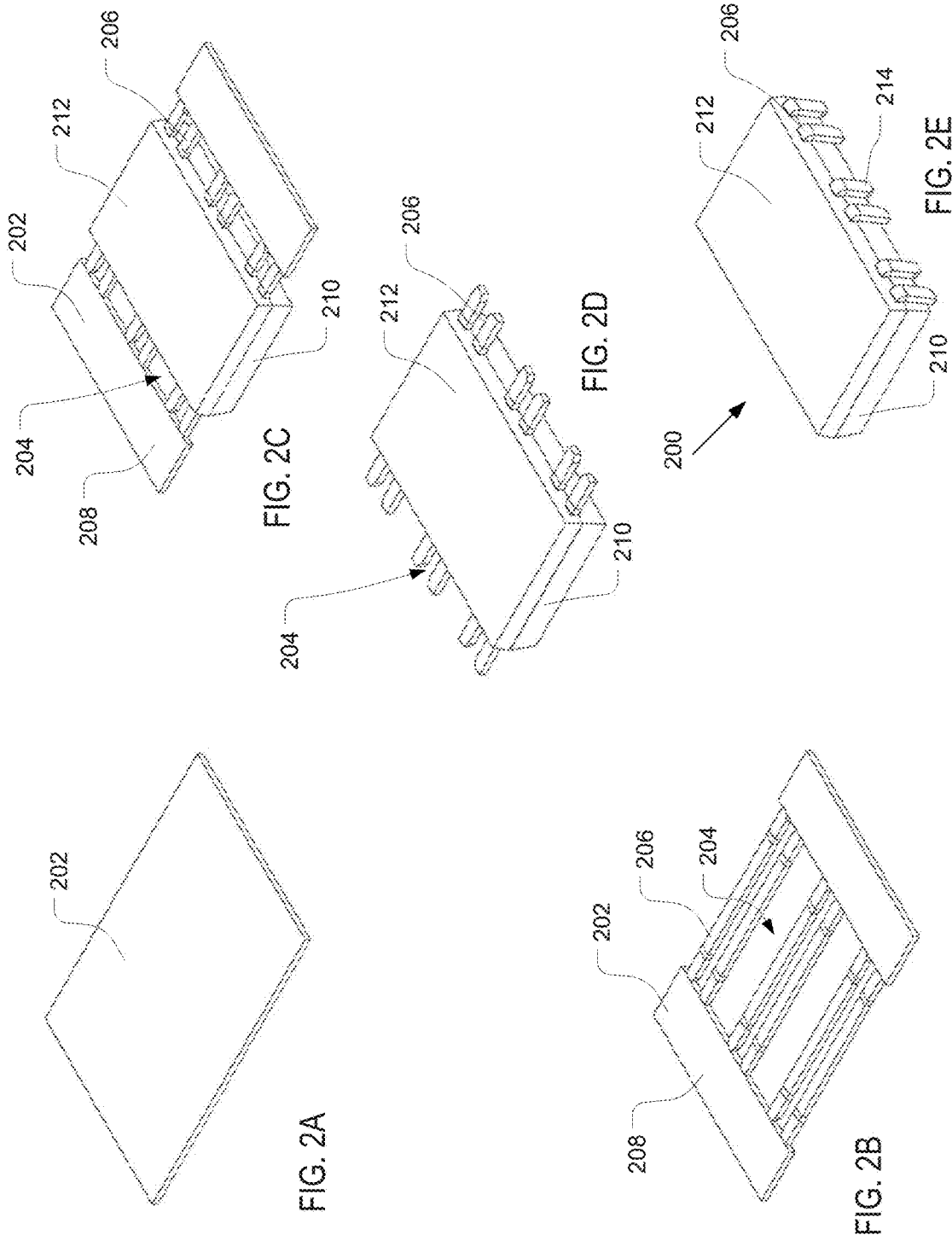

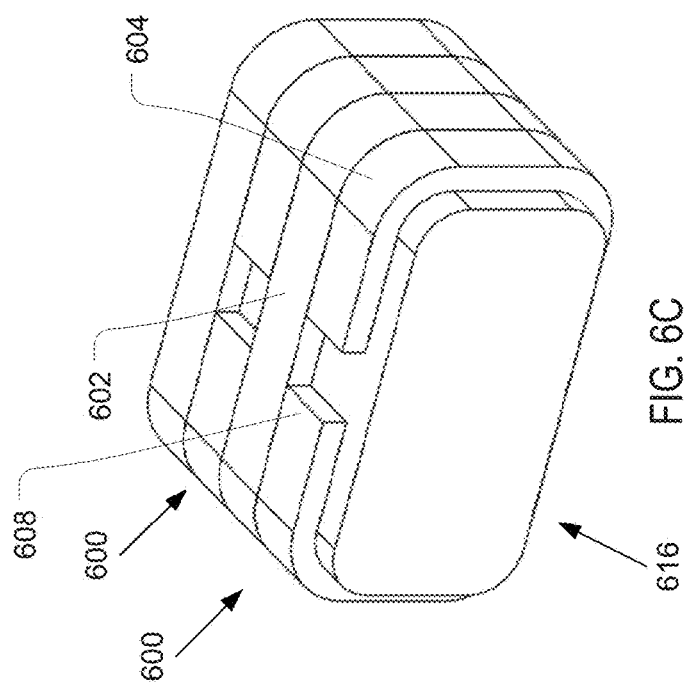
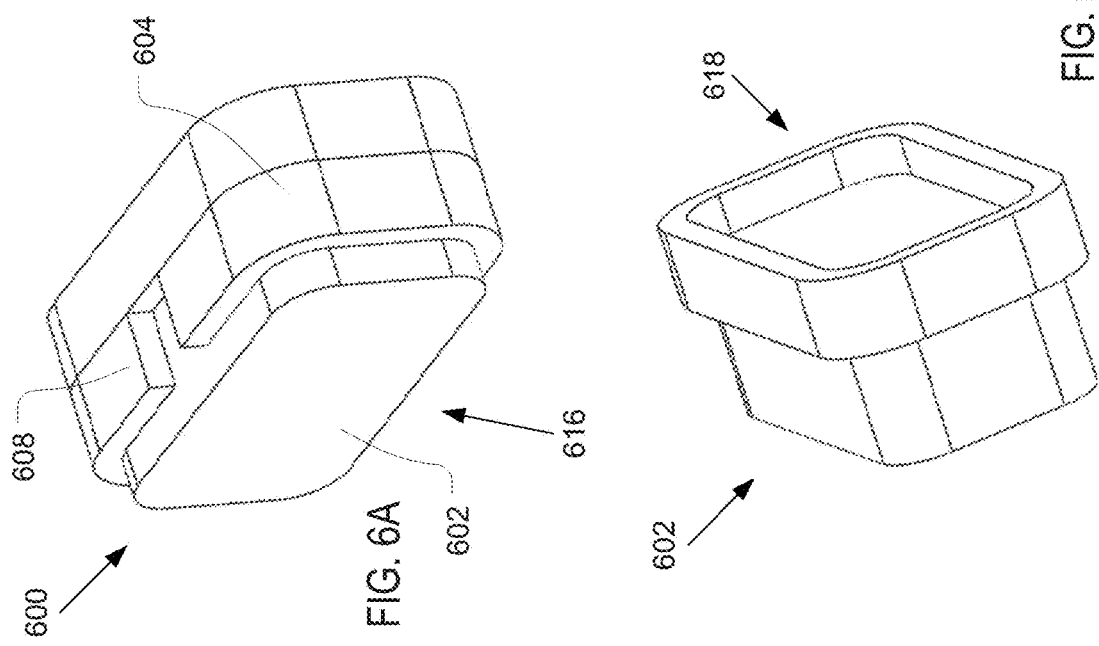

SURFACE-MOUNT INDUCTOR STRUCTURES FOR FORMING ONE OR MORE INDUCTORS WITH SUBSTRATE TRACES

RELATED APPLICATIONS

This application is a continuation of U.S. patent application Ser. No. 13/715,016, entitled "Surface-Mount Inductor Structures for Forming One or More Inductors with Substrate Traces" filed on Dec. 14, 2012, which is hereby incorporated by reference in its entirety.

FIELD

Embodiments of the present disclosure generally relate to the field of integrated circuits, and more particularly, to inductor structures configured for forming one or more inductors with substrate traces, and associated techniques and configurations.

BACKGROUND

In many integrated circuit packages, inductors are needed to regulate electrical power, among other uses. In some IC packages, the inductors are integrated into the IC package to provide voltage regulation. For example, in some IC packages multi-layer inductors are integrated into a circuit board by drilling holes in the circuit board followed by metal fill of the holes to create vias between the layers. However, these inductors require a complex manufacturing process and a relatively large substrate thickness.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 2A illustrates a perspective view of sheet of conductive material used to form an inductor structure, in accordance with some embodiments.

FIG. 2B illustrates a perspective view of the sheet of FIG. 2A with slots formed in the sheet to form strips of conductive material, in accordance with some embodiments.

FIG. 2C illustrates a perspective view of the sheet of FIG. 2B with a core and a housing formed around the strips of conductive material, in accordance with some embodiments.

FIG. 2D illustrates a perspective view of the structure of FIG. 2C with connecting portions of the sheet removed, in accordance with some embodiments.

FIG. 2E illustrates a perspective view of the structure of FIG. 2D with the strips folded into a "U" shape, in accordance with some embodiments.

FIG. 6A illustrates a perspective front view of a modular inductor structure, in accordance with some embodiments.

FIG. 6B illustrates a perspective rear view of the modular inductor structure of FIG. 6A without a strip of conductive material, in accordance with some embodiments.

FIG. 6C illustrates a perspective view of a pair of the modular inductor structures of FIG. 6A coupled to one another, in accordance with some embodiments.

DETAILED DESCRIPTION

Figure 1A:
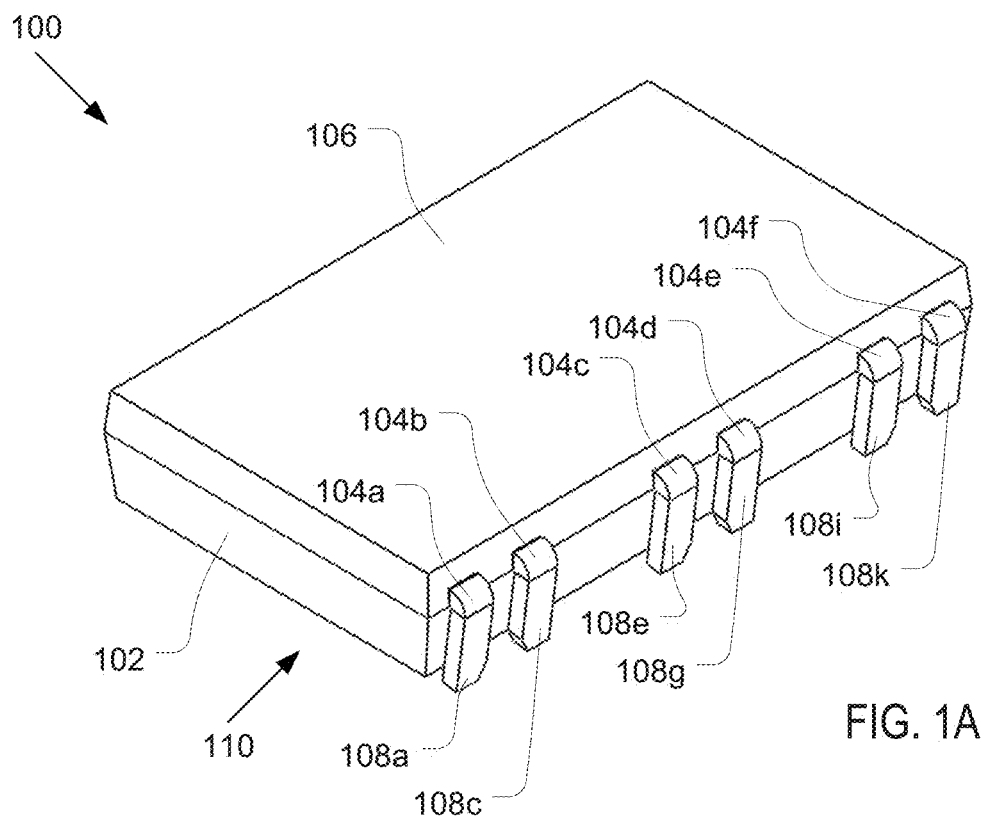
FIG. 1A illustrates a perspective view of an inductor structure, in accordance with some embodiments.

Embodiments of the present disclosure describe surface-mount inductor structures for forming one or more inductors with substrate traces, and associated techniques and configurations. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Figure 1B:
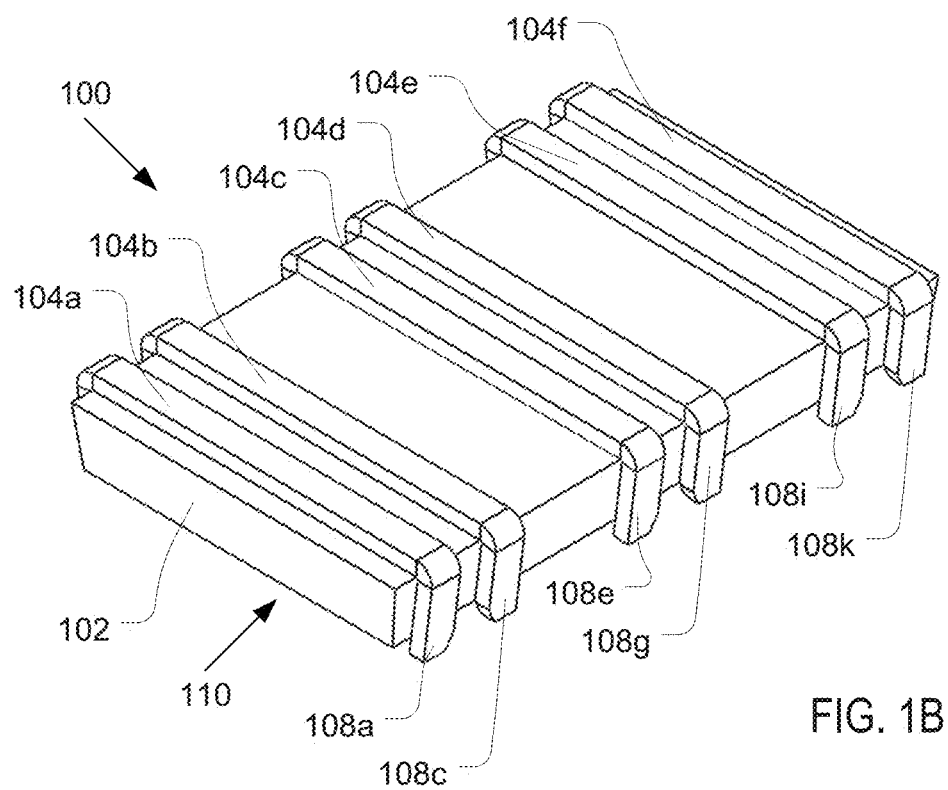
FIG. 1B illustrates a perspective view of the inductor structure of FIG. 1A without the housing in accordance with some embodiments.
Figure 1C:
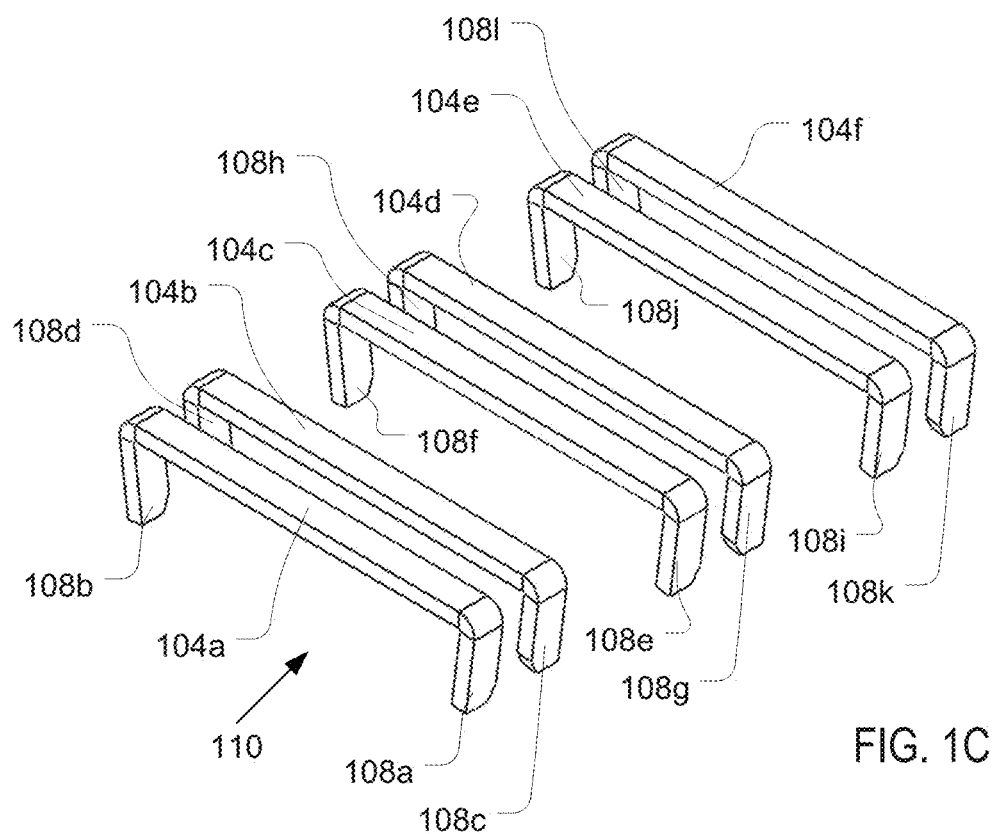
FIG. 1C illustrates strips of conductive material of the inductor structure of FIG. 1A in accordance with some embodiments.

FIG. 1A illustrates an inductor structure 100 in accordance with various embodiments. Inductor structure 100 includes a core 102 and a plurality of strips 104a-f of conductive material. In some embodiments, the inductor structure 100 may further include a housing 106. FIG. 1B illustrates the inductor structure 100 without the housing 106, and FIG. 1C illustrates the strips 104a-f without the core 102 or the housing 106, to more fully illustrate the components of inductor structure 100.

The strips 104a-f include respective contacts 108a-l at ends of the strips 104a-f as best seen in FIG. 2C. In some embodiments, the contacts 108a-l may be surface-mount technology (SMT) contacts to facilitate mounting the inductive structure 100 on a surface of a substrate. The strips 104a-f may be disposed around the core 102 with a gap 110 between the contacts 108a-l of respective individual strips 104a-f across a lower surface of the core 102. The housing 106 may cover a portion of the strips 104a-f and leave the contacts 108a-l exposed.

The inductor structure 100 may be formed of any suitable materials. In some embodiments the core may include an insulating material, such as plastic (e.g., molded plastic). Alternatively, or additionally, the core may include a magnetic material, such as iron and/or ferrite. For example, the core 102 may include a magnetic material surrounded by a non-magnetic material (e.g., plastic), a non-magnetic material with portions of a magnetic material spread throughout the non-magnetic material, and/or the core 102 may be composed entirely of a magnetic material. The magnetic material may improve the magnetic flux and/or efficiency of inductors formed by the inductor structure 100.

The strips 104a-f may include any suitable conductive material or materials, such as copper. In some embodiments, the strips 104a-f may be plated, such as with nickel, tin, palladium, silver and/or gold, to prevent corrosion and/or facilitate soldering. In some embodiments, the inductor structure 100 may further include a housing 106. The housing 106 may be a separate piece or may be integrated with the core 102. For example, in one embodiment, the housing 106 and core 102 may be formed as a single piece by plastic over-molding. Other embodiments of the inductor structure 100 may not include a housing 106.

In various embodiments, the inductor structure 100 may be mounted to a substrate (e.g., substrate 702 shown in FIG. 7 and/or substrate 802 shown in FIG. 8, both of which are discussed further below). One or more traces (not shown) may be formed in a surface of the substrate to electrically couple (e.g. conductively) two or more of the strips 104a-f to one another to form inductive coils. In some embodiments, the one or more traces may be formed across the gap 110 to electrically couple adjacent strips to one another to form an inductive coil. For example, contact 108b of strip 104a may be coupled by a trace to contact 108c of strip 104b. Accordingly, one or more inductors may be formed from the inductor structure 104. The contacts that are not coupled to an adjacent strip (e.g., contacts 108a and 108d in the above example) may be used as input and/or output terminals for the inductor.

In various embodiments, any set of two or more of the strips 104a-f may be coupled to one another by one or more traces to form an inductor. The inductor structure 100 may be used to form any suitable number and/or arrangement of inductors. For example, the inductor structure 100 may be used to form one inductor that includes up to six strips, two inductors that each include three strips, or one inductor including two strips and one inductor including four strips. It will be apparent that many other arrangements of one or more inductors are possible using inductor structure 100. In some embodiments, a transformer, including a first inductor and a second inductor, may be formed from the inductor structure 100. In some embodiments, the one or more inductors formed by the inductor structure 100 may be included in a voltage regulator to convert a supply voltage (e.g., from a power supply) to an input voltage for a circuit (e.g., on a die).

In some embodiments, the spacing between the strips 104a-f may not be the same between each adjacent strip. For example, the strips 104a-f may be arranged into groups of strips that are spaced together. The grouping and/or spacing may facilitate an intended electrical connection among the strips 104a-f, and/or facilitate a desired inductance. As shown in FIGS. 1A-C, the strips 104a-f are arranged in three pairs (e.g., with strips 104a and 104b spaced more closely together than strips 104b and 104c). Other embodiments may include other spacing arrangements of the strips 104a-f. In some embodiments, the strips 104a-f may be spaced evenly from one another.

The inductor structure 100 may be manufactured in any suitable manner. The inductor structure 100 may be manufactured at a relatively low cost, with low manufacturing complexity. For example, in some embodiments, the strips may be formed from conductive wire (e.g., copper wire). The core may be molded, e.g. from plastic. The strips may be bent and/or wrapped around the core to form the inductor structure 100.

In embodiments, the strips may be formed from a sheet of conductive material. For example, FIG. 2A illustrates a sheet 202 of conductive material. An array of slots 204 may be formed in the sheet 202 as shown in FIG. 2B, thereby forming strips 206. The slots 204 may be formed, for example, by metal stamping. A core 210 and housing 212 may be formed around the strips 206, as shown in FIG. 2C. As shown in FIG. 2D, connecting portions 208 of the sheet 202 may be removed to separate the strips 206. The strips 206 may be bent into a desired shape, such as a "U" shape as shown in FIG. 2E, thereby forming an inductor structure 200 with contacts 214. It will be apparent that the operations illustrated in FIG. 2A-E may be performed in any suitable order. For example, in some embodiments, the sheet 202 may be bent into a desired shape prior to forming the core 210 and/or housing 212 around the strips 206 and/or prior to removing the connecting portions 208. In some embodiments, the core 210 and/or housing 212 may be formed around the strips 206 by over-molding.

Referring again to FIGS. 1A-1C, although the core 102 of inductor structure 100 is shown with a cross-sectional shape that resembles a rectangle, it will be apparent that the core 102 may have any suitable cross-sectional shape, such as circular, elliptical, or polygonal.

Figure 3A:
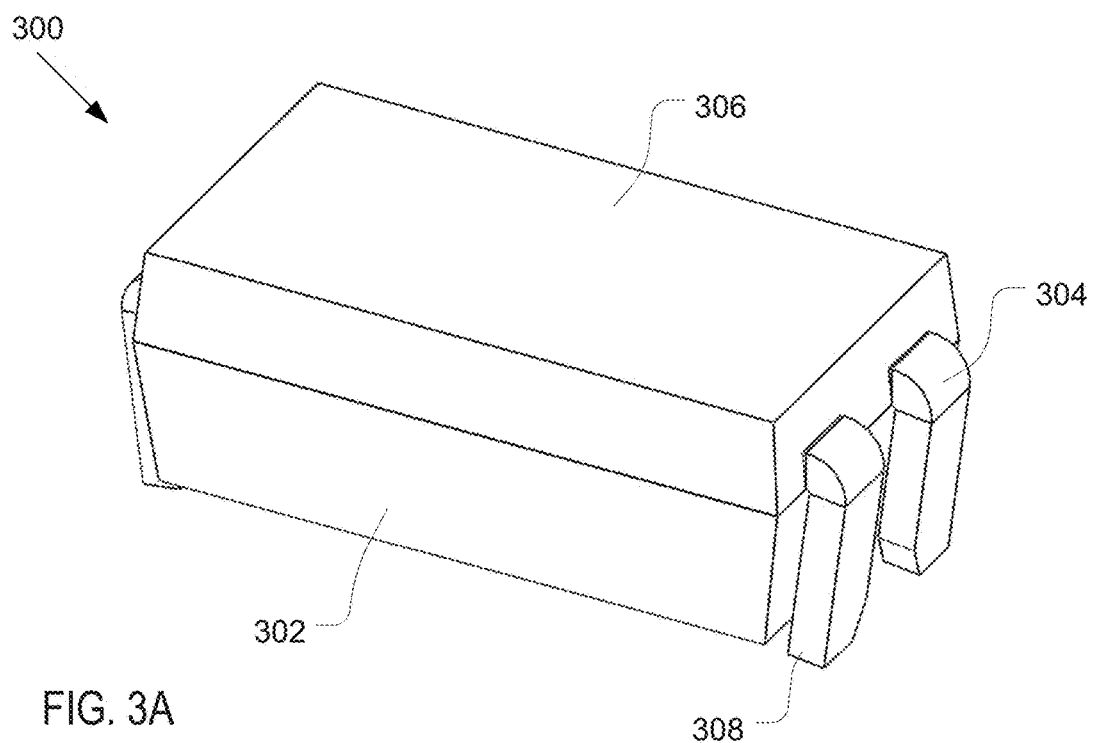
FIG. 3A illustrates a perspective view of an inductor structure, in accordance with some embodiments.
Figure 3B:
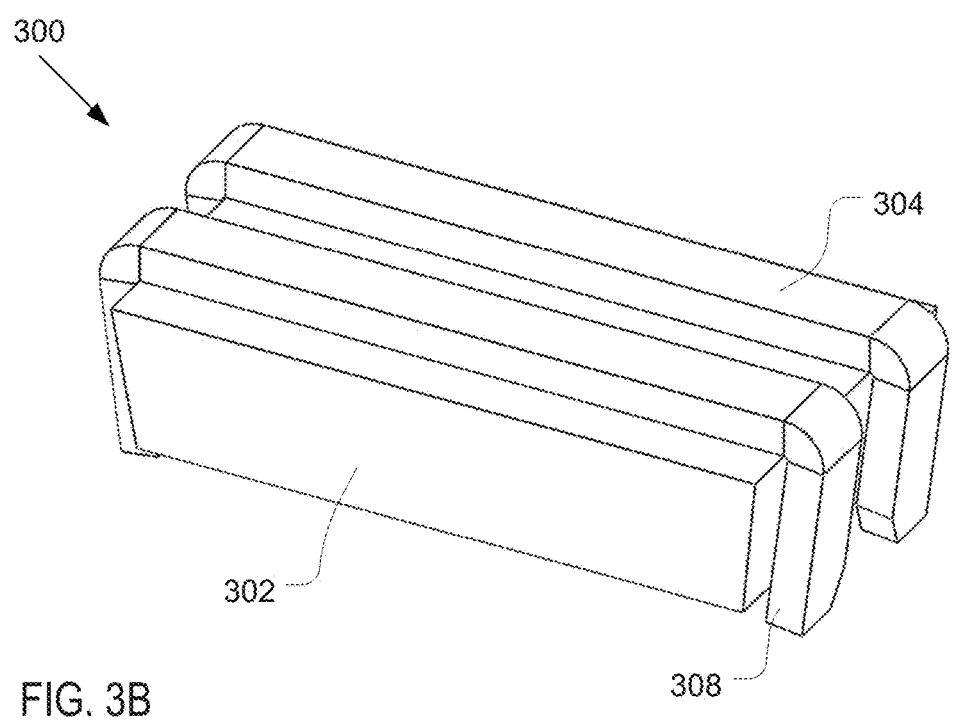
FIG. 3B illustrates a perspective view of the inductor structure of FIG. 3A without the housing, in accordance with some embodiments.
Figure 3C:
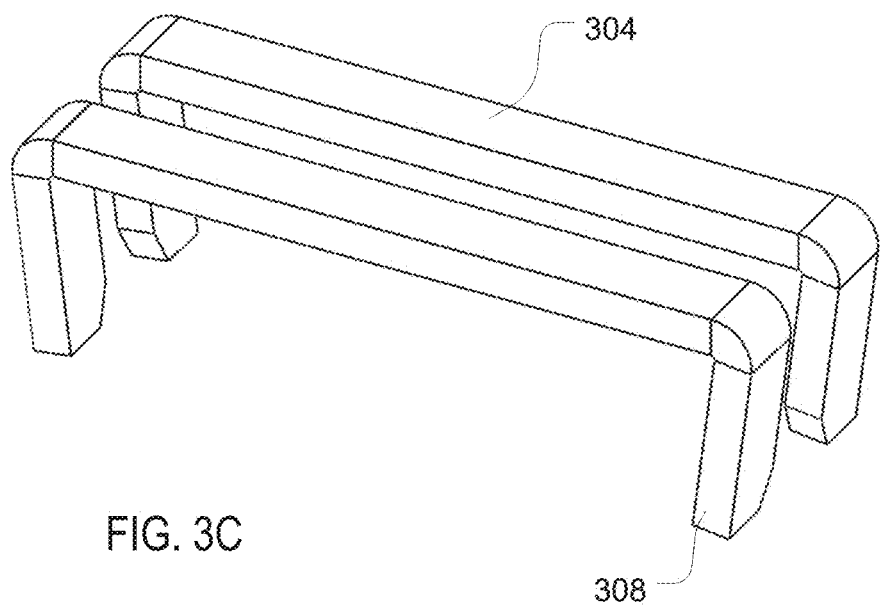
FIG. 3C illustrates strips of conductive material of the inductor structure of FIG. 3A, in accordance with some embodiments.

Additionally, although inductor structure 100 is shown with six strips 104a-f, other embodiments may include any number of one or more strips. For example, FIGS. 3A, 3B, and 3C illustrate an inductor structure 300 having two strips 304 disposed around a core 302 in accordance with various embodiments. The strips 304 include respective contacts 308. The inductor structure 300 further includes a housing 306 that partially covers the strips 304 and leaves the contacts 308 exposed.

Furthermore, it will be apparent that other arrangements of the strips and/or contacts of the inductor structure are possible without departing from the embodiments described herein.

Figure 4:
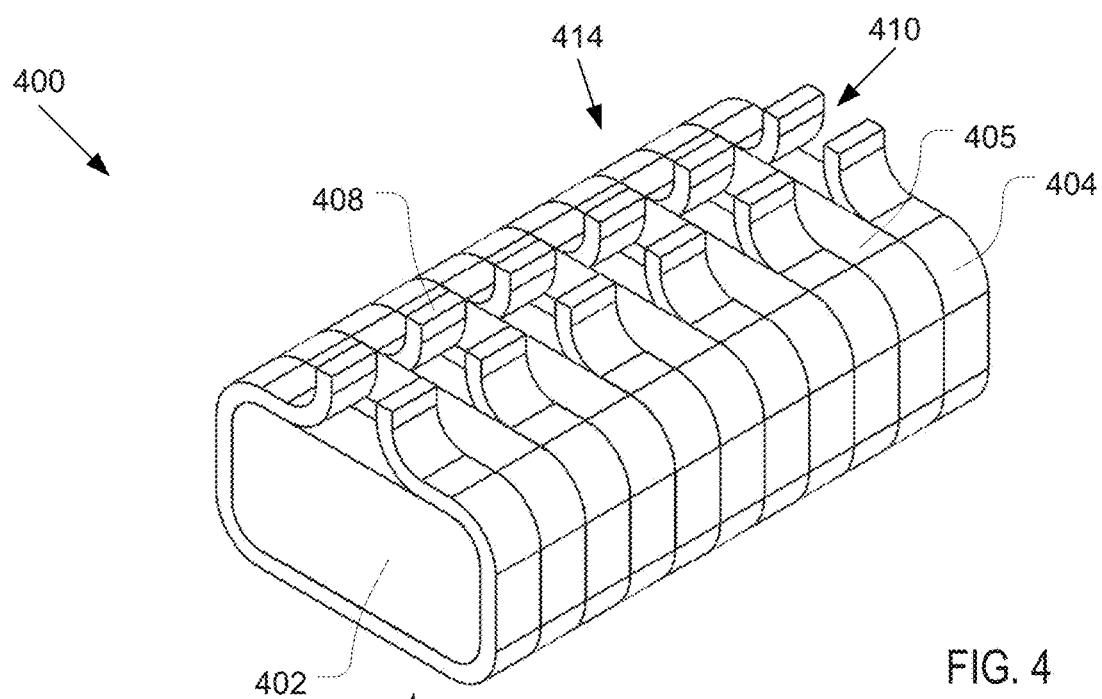
FIG. 4 illustrates a perspective view of an inductor structure, in accordance with some embodiments.

For example, FIG. 4 illustrates an inductor structure 400 with SMT contacts 408 having an alternative arrangement from that of contacts 108a-l. Inductor structure 400 is shown upside-down with contacts 408 pointed upward. The inductor structure 400 includes a core 402 with an upper surface 412 and a lower surface 414. Inductor structure 400 further includes strips 404 that extend across the upper surface 412 of the core 402 and partially across the lower surface 414, leaving a gap 410 between the contacts 408. The core 402 includes ridges 405 to facilitate spacing and/or alignment of the strips 404. The ends of the strips 402 are bent from a plane of the lower surface 414, thereby providing contacts 408 that extend from the lower surface 414. The gap 410 between the contacts 408 of individual strips 404 in inductor structure 400 may be less than the gap 110 between the contacts 108a-l of inductor structure 104 for a core of similar size. This may allow shorter traces to be used to electrically couple the contacts 408 to one another to form one or more inductors.

Figure 5:
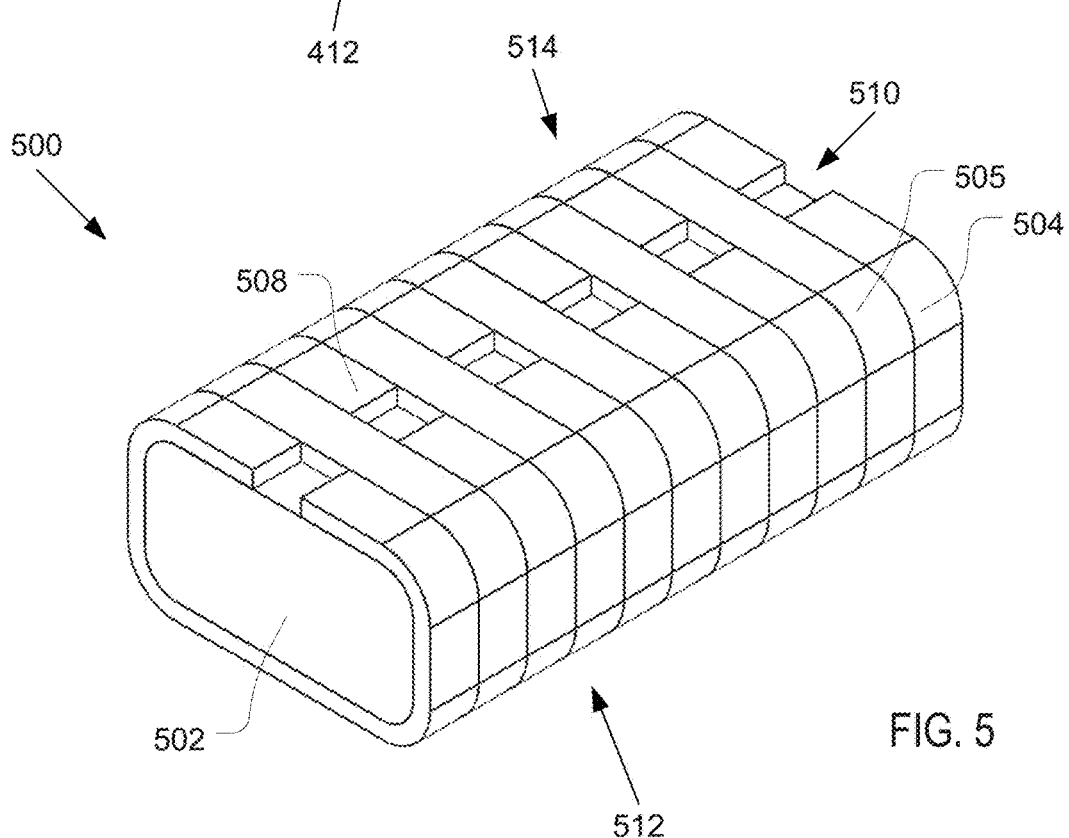
FIG. 5 illustrates a perspective view of an inductor structure, in accordance with some embodiments.

FIG. 5 illustrates another inductor structure 500 that includes flush-mount SMT contacts 508 in accordance with various embodiments. The inductor structure 500 includes a core 502 with an upper surface 512 and a lower surface 514. Inductor structure 500 further includes strips 504 that extend around the upper surface 512 of the and partially across the lower surface 514, leaving a gap 510 between the contacts 508. The contacts 508 are disposed flat against the lower surface 514, thereby allowing for the inductor structure 500 to be flush-mounted onto the substrate.

FIG. 6A illustrates a modular inductor structure 600 in accordance with various embodiments. Inductor structure 600 that may be coupled with one or more other inductor structures 600 to form an array of inductor structures 600. Inductor structure 600 includes a strip 604 (not shown in FIG. 6B) disposed around a core 602. Another view of core 602 is shown in FIG. 6B, without the strip 604. Core 602 further includes a first mating feature 616 and a second mating feature 618. The first mating feature 616 may be mated with the second mating feature 618 of another inductor structure 600 to couple the inductor structures 600 together. Accordingly, the inductor structure 600 may be used to form an array of strips 604 having any desired quantity of strips 604.

FIG. 6C shows two inductor structures 600 coupled to one another. Other embodiments may include any number of one or more inductor structures 600 coupled to one another. Additionally, or alternatively, the individual inductor structures 600 may include any suitable number of one or more strips 604.

Figure 7:
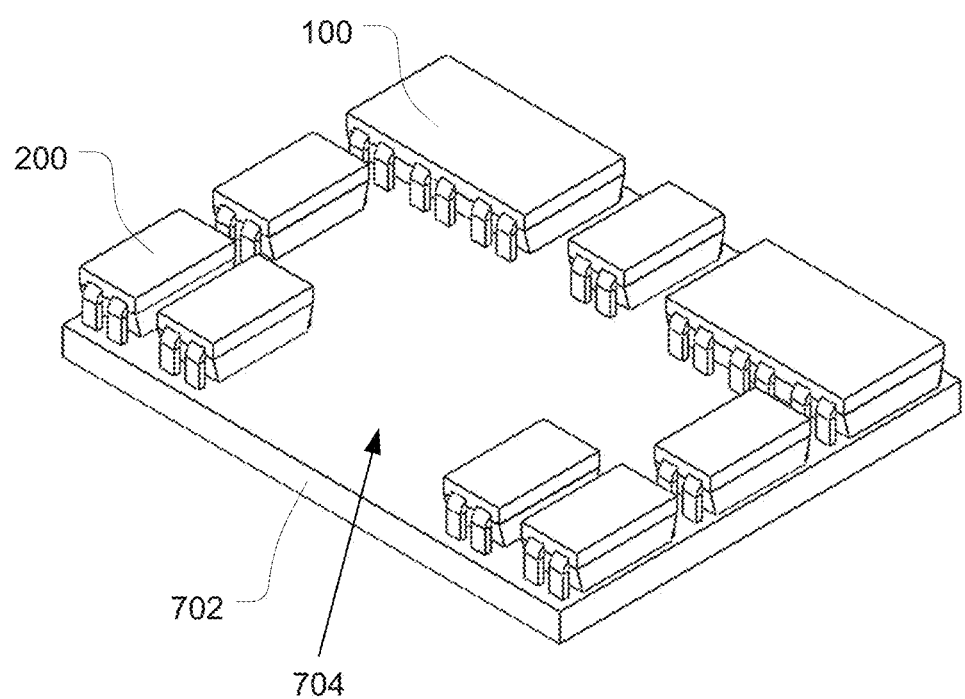
FIG. 7 illustrates a perspective view of a substrate having a plurality of inductor structures mounted to a surface of the substrate, in accordance with some embodiments.

FIG. 7 illustrates an integrated circuit (IC) assembly 700 in accordance with various embodiments. IC assembly 700 includes a substrate 702 with a plurality of inductor structures 100 and a plurality of inductor structures 200 mounted on a surface 704 of the substrate 702. Traces (not shown) may be formed in the surface 704 of the substrate 702 to form inductors from the inductor structures 100 and/or 200.

In some embodiments, the substrate 702 is an epoxy-based laminate substrate having a core and/or build-up layers such as, for example, an Ajinomoto Build-up Film (ABF) substrate. The substrate 702 may include other suitable types of substrates in other embodiments including, for example, substrates formed from glass, ceramic, or semiconductor materials.

Although IC assembly 700 is shown in FIG. 7 to include a plurality of inductor structures 100 and a plurality of inductor structures 200, other embodiments may include any suitable number of one or more inductor structures 100 and/or 200.

In some embodiments, one or more inductor structures as described herein may be mounted on a same substrate on which a die is mounted. In some embodiments, the inductor structures may be used to route electrical power from a power source to the die. For example, the inductor structures may be included in a voltage regulator to regulate the power delivered to the die. In some embodiments, the inductor structure may be mounted on a land side of the substrate, opposite the die.

Figure 8:
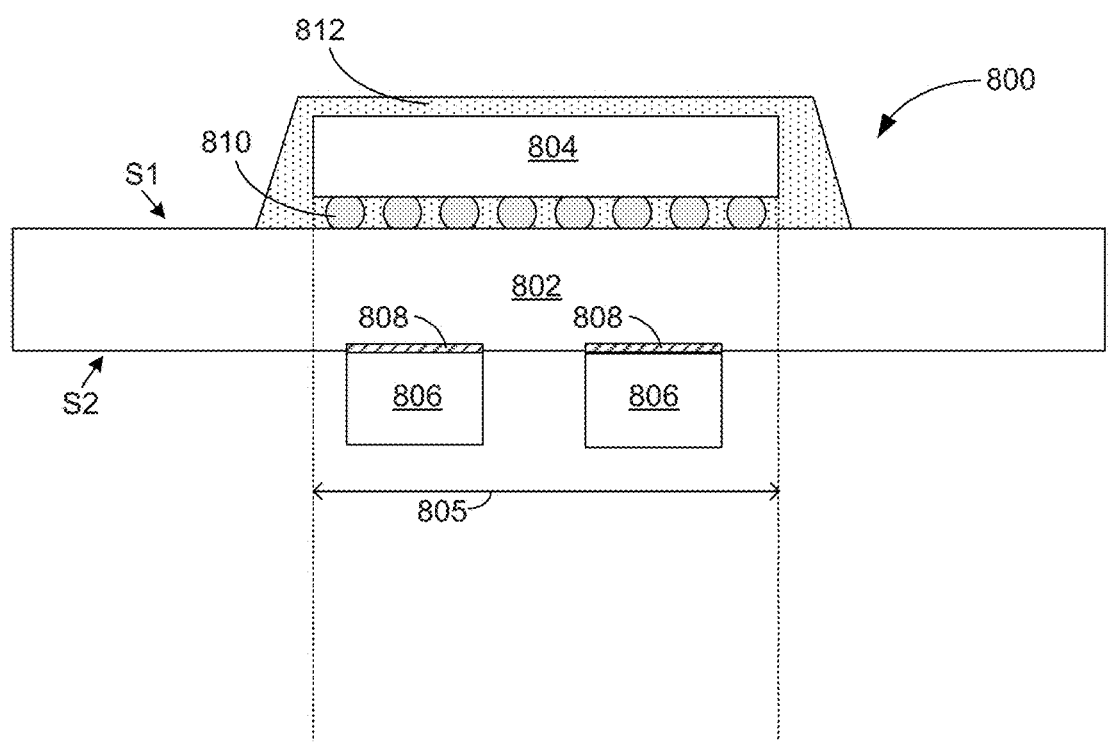
FIG. 8 schematically illustrates a cross-section side view of a integrated circuit (IC) package assembly having an inductor structure mounted on a land side of a substrate of the IC package assembly, in accordance with some embodiments.

For example, FIG. 8 schematically illustrates a cross-section side view of an example integrated circuit (IC) package assembly 800, in accordance with some embodiments. The IC package assembly 800 may also be referred to as a die package assembly. The IC package assembly 800 includes a substrate 802 having a first side, S1, and a second side, S2, opposite the first side. The first side S1 may also be referred to as the die side of the substrate 802, while the second side S2 may also be referred to as the land side of the substrate 802. One or more dies (hereinafter "die 804) may be mounted on the first side S1. In various embodiments, one or more inductor structures 806 may be coupled to the second side S2 of the substrate. Suitable inductor structures 806 may include inductor structures 100, 200, 300, 400, 500, and/or 600 discussed herein.

As discussed herein, the inductor structure 806 may include one or more strips of conductive material having contacts at a first end and a second end of each strip. The strips may be disposed around a core of the inductor structure 806, with a gap between the first end and second end of the individual strips. The strips may be disposed adjacent to one another in an array. The IC package assembly 800 may further include traces 808 on a surface of the second side to electrically couple two or more of the strips of conductive material to one another to form inductive coils. Accordingly, the inductor structure 806 may be used to form one or more inductors in combination with the traces 808.

In some embodiments, the inductor structures 806 may be included in a voltage regulator to route electrical power from a power source (not shown) to the die 804. The voltage regulator may convert a supply voltage provided by the power supply to an input voltage used by the die 804. In some embodiments, the supply voltage may be higher than the input voltage. The voltage regulator may include one or more other components besides inductor structure 806, such as one or more capacitors and/or switches. In some embodiments, the voltage regulator may be a single or multiple phase voltage regulator, such as a Buck voltage regulator.

In some embodiments, one or more inductor structures 806 may be used to form a transformer. The transformer may be used in the voltage regulator. For example, the traces 808 may form a first inductor and a second inductor from one or more of the inductor structures 806. The first inductor may be electrically coupled to the power source and the second inductor may be electrically coupled to the die 804 to transform the supply voltage provided by the power supply to the input voltage used by the die 804.

In some embodiments, the inductor structures 806 may be coupled to the second side S2 within a shadow of the die 804 (shown at 805). In some embodiments, the inductor structures 806 may be mounted to a land-side cavity on the second side S2 of the substrate 802. One or more other devices, such as one or more capacitors, may also be mounted on the second side S2 of the substrate 802.

The die 804 may be attached to the substrate 802 according to a variety of suitable configurations, including a flip-chip configuration, as depicted, or other configurations such as wirebonding and the like. In the flip-chip configuration, an active side of the die 804 is attached to the first side S1 of the substrate 802 using die interconnect structures 810 such as bumps, pillars, or other suitable structures. The active side of the die 804 may have one or more transistor devices formed thereon. The die 804 may represent a discrete chip and may be, include, or be a part of a processor, memory, or application-specific integrated circuit (ASIC) in some embodiments. In some embodiments, an encapsulant 812 such as, for example, molding compound or underfill material may fully or partially encapsulate the die 804.

The die interconnect structures 810 may be configured to route electrical signals between the die 804 and the substrate 802. In some embodiments, the electrical signals may include, for example, input/output (I/O) signals and/or power or ground signals associated with the operation of the die 804.

The substrate 802 may include structures configured to route electrical signals to or from the die 804 and/or inductor structures 806. The structures may include, for example, traces (e.g., traces 808) disposed on one or more surfaces of the substrate 802 and/or internal structures such as, for example, trenches, vias or other interconnect structures (not shown) to route electrical signals through the substrate 802. For example, in some embodiments, the substrate 802 may include structures such as die bond pads (not shown) configured to receive the die interconnect structures 810 and route electrical signals between the die 804 and the substrate 802.

In some embodiments, the substrate 802 is an epoxy-based laminate substrate having a core and/or build-up layers such as, for example, an Ajinomoto Build-up Film (ABF) substrate. The substrate 802 may include other suitable types of substrates in other embodiments including, for example, substrates formed from glass, ceramic, or semiconductor materials.

Figure 9:
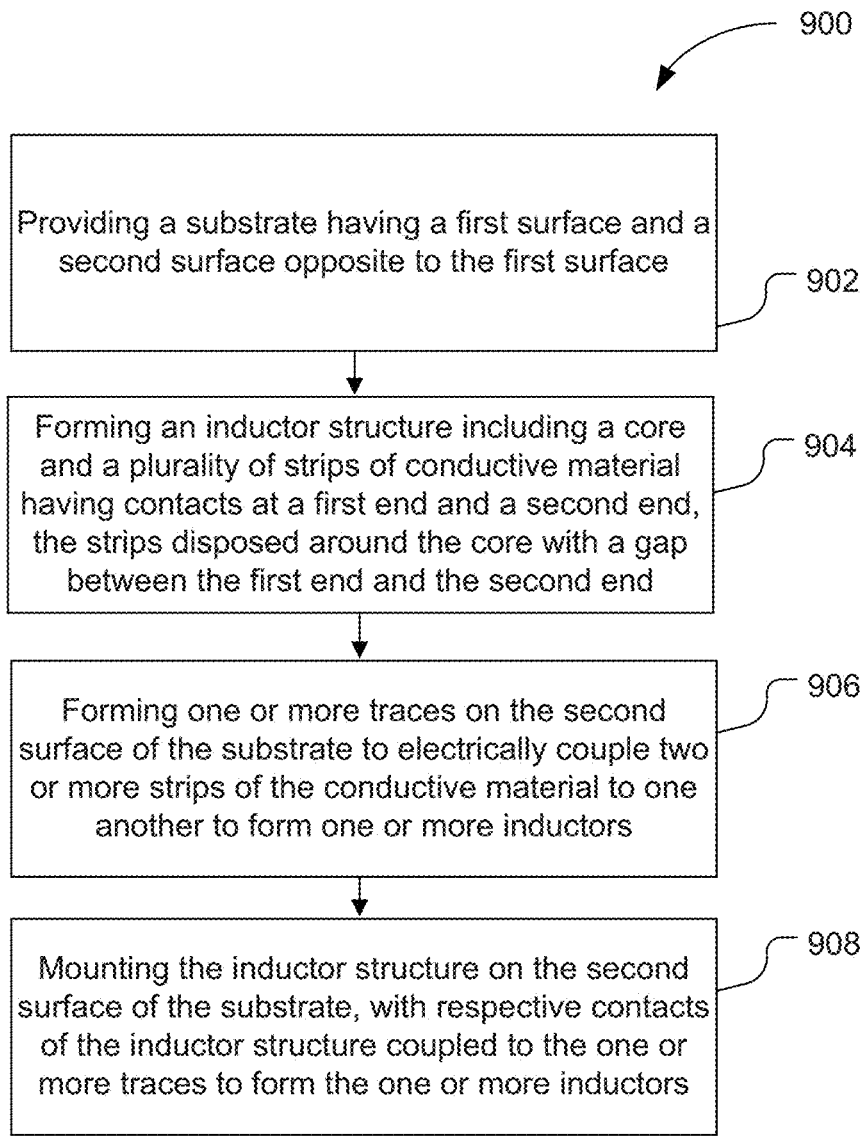
FIG. 9 schematically illustrates a flow diagram for a method of fabricating an inductor structure and mounting the inductor structure on a substrate, in accordance with some embodiments.

FIG. 9 schematically illustrates a flow diagram for a method 900 of fabricating an inductor structure and/or forming one or more inductors from an inductor structure coupled to a substrate, in accordance with some embodiments. The method 900 may comport with embodiments described in connection with FIGS. 1-8.

At 902, the method 900 includes providing a substrate (e.g., substrate 802 of FIG. 8) having a first surface (e.g., S1 of FIG. 8) and a second surface (e.g., S2 of FIG. 8) opposite to the first surface. The first surface may be configured to have a die mounted thereon in some embodiments.

In some embodiments, the method 900 may further include forming the substrate. The substrate may be formed using techniques such as, for example, lamination of electrically insulative materials, deposition of electrically conductive materials, patterning of the electrically conductive materials by additive or subtractive processes, creating holes or vias by mechanical means, laser drilling or etch processes, the like, and other techniques.

At 904, the method 900 further includes forming an inductor structure (e.g., inductor structure 100, 200, 300, 400, 500, 600, and/or 806 described herein). The inductor structure may include a core and a plurality of strips of conductive material having contacts at a first end and a second end. The strips may be disposed around the core with a gap between the first end and the second end.

In some embodiments, forming the inductor structure at 904 may include forming the strips from a sheet of conductive material and/or over-molding the core around the strips (e.g., as shown in FIGS. 2A-2E and described above). Other embodiments may include forming the strips from conductive wire and bending and/or wrapping the strips around the core.

At 906, the method 900 further includes forming one or more traces (e.g., traces 808) on the second surface of the substrate to electrically couple two or more strips of the conductive material to one another to form one or more inductors. The traces may be formed by any suitable method, such as etching to form a stencil on the second surface.

At 908, the method 900 further includes mounting the inductor structure on the second surface of the substrate. The inductor structure may be mounted on the second surface with respective contacts of the inductor structure coupled to the one or more traces to form the one or more inductors. For example, the inductor structure may be mounted with the contacts disposed in or on holes in the stencil that are electrically connected by the traces. The contacts may be coupled to the second surface, for example, by soldering.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Figure 10:
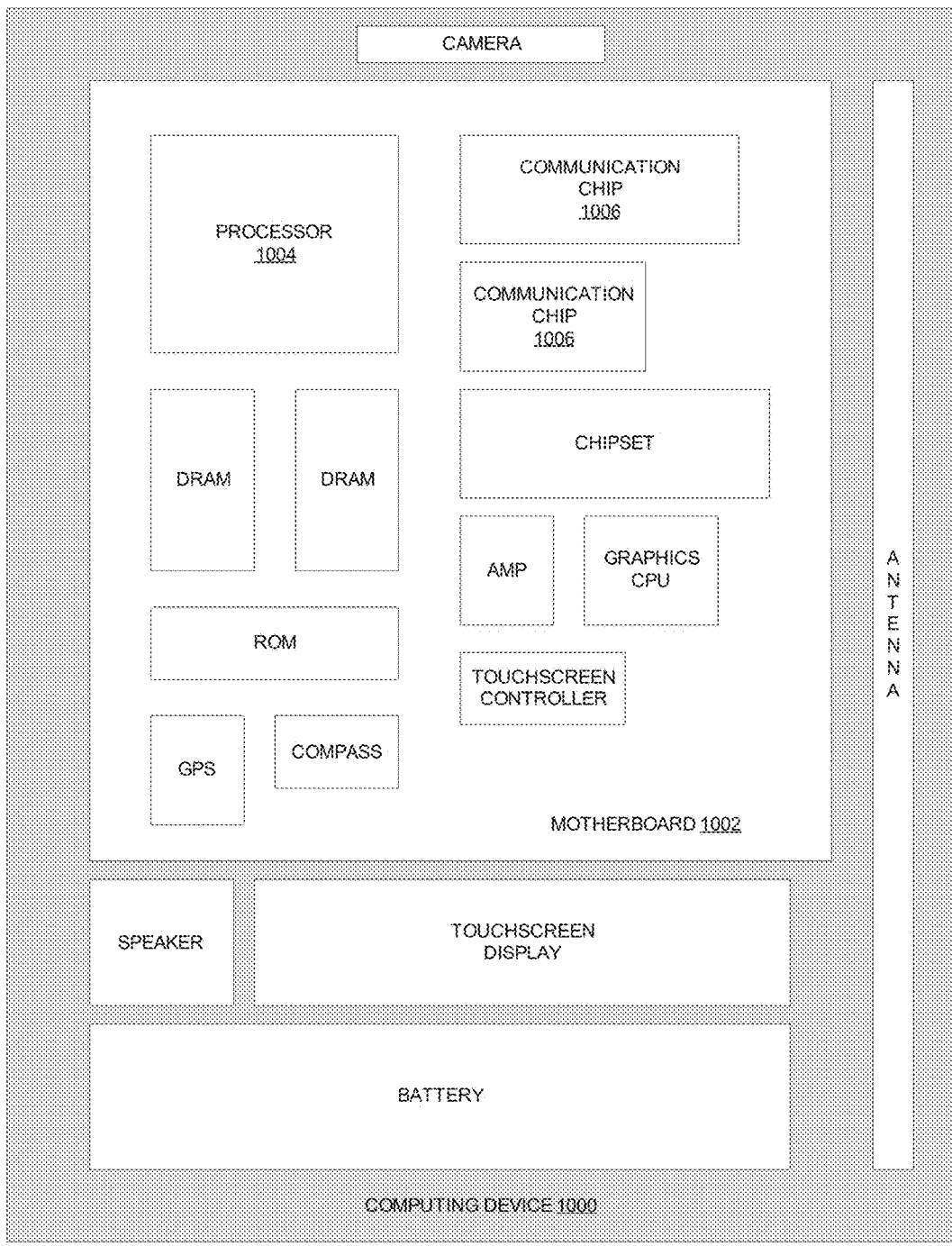
FIG. 10 schematically illustrates a computing device in accordance with one implementation of various embodiments disclosed herein.

FIG. 10 schematically illustrates a computing device 1000 in accordance with one implementation of the invention. The computing device 1000 may house a board such as motherboard 1002. According to various embodiments, the motherboard 1002 may be a substrate (e.g., substrate 702 of FIG. 7 and/or substrate 802 of FIG. 8) having one or more inductor structures (e.g., inductor structures 100, 200, 300, 400, 500, 600, and/or 806) mounted to a surface of the substrate as described herein. The motherboard 1002 may include a number of components, including but not limited to a processor 1004 and at least one communication chip 1006. The processor 1004 may be physically and electrically coupled to the motherboard 1002. In some implementations, the at least one communication chip 1006 may also be physically and electrically coupled to the motherboard 1002. In further implementations, the communication chip 1006 may be part of the processor 1004. According to various embodiments, the processor 1004, the communication chip 1006 or other components (e.g., memory devices) described in connection with the computing device 1000 may be in the form of one or more dies (e.g., die 804 of FIG. 8) as described herein. The one or more inductor structures may be disposed on the motherboard 1002 and/or on a die package substrate. In some embodiments, the one or more inductors may be disposed on the land-side of the die package substrate, within a die shadow region (e.g., indicated by arrow 805 of FIG. 8).

Depending on its applications, computing device 1000 may include other components that may or may not be physically and electrically coupled to the motherboard 1002. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 1006 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1006 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1006 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1006 may operate in accordance with other wireless protocols in other embodiments.

The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 may include a die (e.g., die 804 of FIG. 8) in an IC package assembly (e.g., IC package assembly 800 of FIG. 8) as described herein. The term "processor" may refer to any device or portion of a device that processes electronic data from registers and/or memory to transform that electronic data into other electronic data that may be stored in registers and/or memory.

The communication chip 1006 may also include a die (e.g., die 804 of FIG. 8) in an IC package assembly (e.g., IC package assembly 800 of FIG. 8) as described herein. In further implementations, another component (e.g., memory device or other integrated circuit device) housed within the computing device 1000 may contain a die (e.g., die 804 of FIG. 8) in an IC package assembly (e.g., IC package assembly 800 of FIG. 8) as described herein.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. An electronic device comprising:
   a substrate with:
   a first side;
   a second side opposite the first side; and
   a trace that is generally parallel with the first side;
   a die coupled with the first side by one or more die interconnect structures;
   an encapsulant coupled with the die and the first side;
   a first inductor structure coupled with the second side within a die-shadow of the die, wherein the first inductor structure includes a first core that includes a magnetic material and has a first plurality of strips of conductive material disposed therein, and wherein respective first strips of the first plurality of strips include respective contacts at a first end and a second end of the respective first strips, the respective contacts coupled with the substrate such that a contact of a first one of the first plurality of strips is coupled with a contact of a second one of the first plurality of strips via the trace, wherein the respective first strips have a gap between the first end and the second end of the respective first strips, and the first inductor structure has a gap between each of the respective first strips of the first plurality of strips; and a second inductor structure coupled with the second side within the die-shadow of the die, wherein the second inductor structure includes a second core with a second plurality of strips of conductive material disposed therein, wherein respective second strips of the second plurality of strips include respective contacts at a first end and a second end of the respective second strips, the respective contacts coupled with the substrate, wherein the respective second strips have a gap between the first end and the second end of the respective second strips, and the second inductor structure has a gap between each of the respective second strips of the second plurality of strips.

2. An electronic device comprising:

a substrate with a first side and a second side opposite the first side;

a die coupled with the first side by one or more die interconnect structures;

a first inductor structure coupled with the second side, wherein the first inductor structure includes a first core with a first plurality of strips of conductive material disposed therein, wherein respective first strips of the first plurality of strips include respective contacts at a first end and a second end of the respective first strips, the respective contacts coupled with the substrate, wherein the respective first strips have a gap between the first end and the second end of the respective first strips, and the first inductor structure has a gap between each of the respective first strips of the first plurality of strips; and a second inductor structure coupled with the second side, wherein the second inductor structure includes a second core with a second plurality of strips of conductive material disposed therein, wherein respective second strips of the second plurality of strips include respective contacts at a first end and a second end of the respective second strips, the respective contacts coupled with the substrate, wherein the respective second strips have a gap between the first end and the second end of the respective second strips, and the second inductor structure has a gap between each of the respective second strips of the second plurality of strips;

wherein the substrate further includes a trace that is generally parallel with the first side of the substrate, the trace to couple a contact of a first one of the first plurality of strips with a contact of a second one of the first plurality of strips.

3. The electronic device of claim 2, further comprising an encapsulant coupled with the die and the first side.

4. The electronic device of claim 2, wherein the core of the first inductor structure includes a magnetic material.

5. The electronic device of claim 4, wherein the magnetic material is iron or ferrite.

6. The electronic device of claim 4, wherein the core of the first inductor structure further includes a non-magnetic material.

7. The electronic device of claim 6, wherein the magnetic material is spread throughout the non-magnetic material.

8. The electronic device of claim 2, wherein the first inductor structure and the second inductor structure are within a die-shadow of the die.

9. The electronic device of claim 8, wherein the die has a lateral area parallel with the first side of the substrate, and the die-shadow is a portion of the die that is perpendicular to the first side of the substrate within the lateral area of the die.

\* \* \* \* \*